(12) United States Patent
Honma et al.

(10) Patent No.: US 6,992,000 B2
(45) Date of Patent: Jan. 31, 2006

(54) METHOD OF PLATING NONCONDUCTOR PRODUCT

(75) Inventors: Hideo Honma, Yokohama (JP); Atsushi Kawahara, Yokohama (JP); Akira Teranishi, Yokosuka (JP)

(73) Assignees: Kanto Kasei Co., Ltd., Yokosuka (JP); Kanto Gakuin University Surface Engineering Research Institute, Yokohama (JP); Toyota Jidsoha Kabushiki Kaisha, Toyota (JP)

( * ) Notice: Subject to any disclaimer, the term of this patent is extended or adjusted under 35 U.S.C. 154(b) by 58 days.

(21) Appl. No.: 10/486,169

(22) PCT Filed: Aug. 28, 2002

(86) PCT No.: PCT/JP02/08655

§ 371 (c)(1),
(2), (4) Date: Feb. 4, 2004

(87) PCT Pub. No.: WO03/021005

PCT Pub. Date: Mar. 13, 2003

(65) Prior Publication Data

US 2004/0219374 A1 Nov. 4, 2004

(30) Foreign Application Priority Data

Aug. 31, 2001 (JP) .................................. 2001-262790
Apr. 10, 2002 (JP) .................................. 2002-107356

(51) Int. Cl.
*H01L 21/26* (2006.01)
*H01L 21/42* (2006.01)

(52) U.S. Cl. ........................................ 438/535; 438/903
(58) Field of Classification Search ................ 438/535, 438/463, 473, 678, 795, 798, 903
See application file for complete search history.

(56) References Cited

U.S. PATENT DOCUMENTS 5,580,616 A * 12/1996 Niino et al. ................ 427/554
6,511,190 B2 * 1/2003 Ohgane ...................... 359/856
6,709,806 B2 * 3/2004 Hotta et al. ................. 430/322

* cited by examiner

*Primary Examiner*—David Nhu
(74) *Attorney, Agent, or Firm*—Flynn, Thiel, Boutell & Tanis, P.C.

(57) ABSTRACT

A nonconductor product is soaked in a solution suspending a semiconducting powder and is subjected to light irradiation in the solution so that polar group is formed on the surface of the nonconductor product, and then electroless plating is performed on the surface on which the polar group is formed. A resin product is subjected to electroless plating after ultraviolet treatment in which ultraviolet rays are irradiated through water or a solution is performed. Further, electroless plating or electroplating with a different or the same kind of metal is performed on the electroless-plated layer formed by electroless plating. With the method like this, the plated nonconductor product which does not cause problems such as environmental pollution and waste liquid treatment, and whose surface and plated coating is firmly adhered to each other, and, when a resin product is used as an object to be plated, deformation by heat of the resin product can be prevented, and moreover, the adherent strength of the plated coating can be improved.

17 Claims, 1 Drawing Sheet

FIG. 1

METHOD OF PLATING NONCONDUCTOR PRODUCT

FIELD OF THE INVENTION

The present invention relates to, in performing electroless plating on the surface of a nonconductor product, a method of plating a nonconductor product in which the product is pretreated and then treated with electroless plating, to a method of plating a nonconductor product in which electroless plating or electroplating is performed on the formed electroless plated layer, and to the nonconductor product plated with these methods, with the plated nonconductor product being advantageously used for wheeled vehicles, information equipment, office equipment, ornamental articles and the like.

BACKGROUND OF THE INVENTION

As a method of giving conductivity or metallic luster to a nonconductor product, there have been known a method of depositing metal to the nonconductor product in vacuum, a method of sputtering metal to the same, a method of electroless plating on the same, and the like. Electroless plating is a method of chemically reducing and depositing metal ions in a solution to make a metallic coating form on the surface of the material, even on the surface of an insulating material including a resin and the like, which is different from electroplating in which a metal coating is electrolytically deposited by electricity.

Plated coatings formed by electroless plating, however, have the problem of not having sufficient adherent strength to the surface of the material. Therefore, when electroless plating is carried out, there have been known, as pretreatment thereof, methods of electroless plating such as surface roughening in which the surface of a nonconductor product is chemically etched, with the addition of a polar group and treatment by a catalyst. Treatments of surface roughening and addition of the polar group are mainly carried out with chemicals including chromic acid, permanganic acid, and sulfuric acid and the like. These chemicals have a problem that they become a cause of environmental pollution and cost a huge sum for treatment of the waste liquid. Further, surface roughening and addition of the polar group are performed with a treatment by plasma or corona discharge and the like. As the treatment by plasma or corona discharge and the like should be generally done in a vacuum, there becomes a problem in the productivity, and the development of alternative treatment methods have been sought.

As a method of electroless plating on a resin product, Japan Patent Laid-Open Publication No. 1-092377 discloses a method in which a resin molding is pretreated with ozone gas and is then treated with electroless plating. According to the same publication, unsaturated bonds on the surface of resin are cleaved by ozone gas to turn into low molecules, molecules with different compositions coexist on the surface, depriving smoothness from the surface to make it rough. The same publication thus describes that the coating formed with electroless plating penetrates well into the rough surface without being stripped off easily.

In the method described above, adherent strength of the plated coating is improved by roughening the resin surface, namely, by a so-called anchoring effect. In the method of roughening the surface, however, the smoothness thereof is lowered, so that, in order to obtain a surface with a metallic luster having a high-grade design performance, the plated coating needs to be thickened, which causes a disadvantage of an increased number of man-hours.

Japan Patent Laid-Open Publication No. 8-253869 thus discloses a method in which electroless plating is performed after ultraviolet rays are irradiated on a resin surface. With this method, the resin surface is activated by ultraviolet radiation, and active groups on the activated resin surface chemically bond with the molecules of metal which is the material for plating, making the adherent strength of the plated coating improved. Further, as the resin surface is not easily roughened, a metallic luster having a high-grade design performance can be obtained.

Japan Patent Laid-Open Publication No. 10-88361 further discloses a method in which electroless plating is performed in such a way that, after ultraviolet rays are irradiated on a resin molding as a pretreatment for electroless plating, the resin molding is contacted with an alkali solution containing a nonionic surfactant having a polyoxyethylene linkage. Also with this method, as the resin surface is activated by ultraviolet radiation and is not easily roughened, a metallic luster having high-grade design performance can be obtained.

In the meantime, a light source for ultraviolet radiation generates not only ultraviolet rays but also infrared and far-infrared rays. In addition, in order to activate a resin surface, a large quantity of energy as well as radiation for a relatively long period of time is necessary. A large quantity of heat is thus applied to the resin molding from the light source at the time of ultraviolet radiation, which may disadvantageously cause deformation of the resin molding by heat in some types of resin. Further, in some forms of the resin molding, a shadowed section from ultraviolet radiation is made due to being situated in a dead area of the light axis, which may make it difficult to irradiate ultraviolet rays onto the shadowed section.

According to a study made by the present inventors, on the other hand, when the dosage of ultraviolet irradiation is too much, it is evidently observed that the adherent strength of the plated coating, on the contrary, lowers.

As a method of giving a metallic luster to a nonconductor product, the methods as described above may satisfy the need in some cases, but according to the usage of the nonconductor product, further electroless plating or electroplating thereon may be required when a higher endurance and fanciness is required.

The present invention is made in view of the situation described above, and the object of the present invention is; firstly, to provide a method of plating a nonconductor product in which, when the nonconductor product is pretreated by electroless plating, the plated nonconductor product with the plated layer and the surface of the nonconductor product being tightly adhered to each other can be obtained without causing any problems such as environmental pollution and treatment of the waste liquid; secondly, to provide a method of plating a nonconductor product in which, when a resin product is pretreated as an object to be plated by electroless plating using ultraviolet radiation, deformation of the resin product by heat can be prevented and the adherent strength of the plated coating can be further improved; thirdly, to provide a method of plating a nonconductor product in which a plated coating with a higher endurance and fanciness can be formed thereon; and fourthly, to provide the plated nonconductor product obtained by these methods.

DISCLOSURE OF THE INVENTION

The invention to solve the first problem described above is a method of plating a nonconductor product characterized in that the nonconductor product is soaked in a solution suspending a semiconducting powder, the polar group is formed on the surface of the nonconductor product by light irradiation in the solution, and electroless plating is performed on the surface on which the polar group is formed.

In this invention, as the preferred semiconductor, one selected from the group consisting of titanium dioxide, zinc oxide, cadmium sulfide, gallium phosphide, silicon carbide, indium oxide, and vanadium oxide is exemplified, and the particle diameter of the semiconducting powder is preferably in the range from 0.1 to 1,000 µm. Further, in this invention, the solution suspending the semiconducting powder is preferably an aqueous or nonaqueous solution, the irradiated light is preferably ultraviolet light or visible light, and the polar group is preferably formed directly on the surface of the nonconductor product. Moreover, in this invention, as preferred material of the nonconductor product, one selected from the group consisting of a resin, rubber, ceramics and glass is exemplified, and if the nonconductor product comprises a resin, the resin may contain a semiconducting powder.

The invention to solve the second problem described above is a method of plating a nonconductor product characterized in that, after a resin product is treated with ultraviolet radiation through water or a solution, the resin product is subjected to electroless plating.

In this invention, ultraviolet treatment is preferably performed in such a way that the resin material is soaked in water or a solution while bubbling of air is carried out therein. The solution used is preferably a solution containing a dissolved oxidizing agent or alkali material. Further, it is preferable to, after the ultraviolet treatment as well as before the electroless plating, give the resin material a second treatment in which at least one of the anionic surfactant and nonionic surfactant as well as a solution containing an alkali ingredient(s) are contacted with the resin material.

The invention to solve the above third problem described above is, a method of plating a nonconductor product in which electroplating with a different or the same kind of metal is further performed on the electroless-plated layer formed by electroless plating in the invention described above.

In the invention described above, as the metal for electroless plating, a metal selected from the group consisting of nickel, copper, gold, silver, and a metallic compound thereof is exemplified.

The invention to solve the fourth problem described above is the plated nonconductor product obtained with the methods described above.

PREFERRED EMBODIMENTS OF THE INVENTION

The present invention is described below in detail.

(1) The method of plating a nonconductor product to solve the first problem is that the nonconductor product is soaked in a solution suspending a semiconducting powder, the polar group is formed on the surface of the nonconductor product by light irradiation in the solution, the surface on which the polar group is formed is contacted with a catalyst(s) and activated according to the common procedure, and then electroless plating is performed thereon.

The semiconducting powder used for this invention is semiconducting powder having the character of a photoelectrode. Examples of the semiconductor are preferably titanium dioxide, zinc oxide, cadmium sulfide, gallium phosphide, silicon carbide, indium oxide, and vanadium oxide and the like. Anatase-type titanium dioxide is more preferable.

A semiconducting powder in any form can be used. The particle diameter of the powder is preferably in the range from 0.1 to 1,000 µm, more preferably from 0.1 to 10 µm, and further preferably from 0.1 to 5 µm. If the anatase-type titanium dioxide is used in particular, the particle diameter of the powder is preferably in the range from 0.1 to 3 µm.

In this method, the nonconductor product is soaked in a solution suspending a semiconducting powder, and it is preferable that the solution is agitated and the semiconducting powder is uniformly dispersed in the solution.

The solution used for the present invention preferably contains the semiconducting powder in an amount of 0.01 to 99% by weight. If the semiconducting powder content is less than 0.01% by weight, the polar group may not be formed sufficiently on the surface of the nonconductor product in the treatment by light irradiation. On the other hand, if the semiconducting powder content is more than 99% by weight, the polar group may not be dispersed uniformly. The semiconducting powder content is more preferably in the range of from 0.01 to 20% by weight.

In addition, the semiconducting powder can carry a metal, including platinum and palladium and the like, in an amount of from 0.01 to 10% by weight to the gross weight of the semiconducting powder. If the semiconducting powder carrying a metal, including platinum and palladium and the like, is used, the polar group is added to the surface of the nonconductor product more effectively.

The solution to suspend a semiconducting powder used for the present invention is an aqueous or nonaqueous liquid, and as the aqueous solution to suspend a semiconducting powder, water, sulfuric acid solution, nitric acid solution and the like is exemplified with a liquid containing a sulfonic group, nitro group and the like being preferable. The concentration of a solution with sulfuric acid or nitric acid is preferably in the range from 0.01 to 99% by weight, and more preferably in the range from 0.1 to 20% by weight. Thus, for example, in nitric acid is contained in the solution, addition of the nitro group changes the state of the resin surface from being stable to unstable, which is preferable because the plated layer to be formed is firmly adhered to the surface. As the nonaqueous liquid, alcohols and ethers are exemplified.

The solution to suspend a semiconducting powder can be added with a photosensitizing agent in the range from 1 to 50% by weight to the gross weight of the solution. Adding a photosensitizing agent effectively adds the polar group to the surface of the nonconductor product. As the photosensitizing agent, each ion of palladium, nickel, copper, iron, gold, platinum and the like is exemplified, with an iron ion being preferable.

The irradiated light is preferably ultraviolet or visible light, and ultraviolet radiation is preferable in particular. Examples of the light source are a low-pressure mercury lamp, high-pressure mercury lamp, xenon lamp, tungsten lamp, halogen lamp, various kinds of laser including excimer laser, barrier discharge lamp, dielectric barrier discharge lamp, microwave electrodeless discharge lamp, overdischarge lamp, and the like. If the nonconductor product is made of, for example a resin, ultraviolet light with which the bonds on the resin surface is cleaved leading to a stable plated layer is preferable. Ultraviolet light is also called ultraviolet rays, referring to light with a wavelength in the range from 400 to 4 nm. Visible light, in the meantime, is also called visible rays, referring to light with a wavelength in the range from 400 to 750 nm.

With this method, the polar group is formed by light irradiation on the surface of the nonconductor product. The period of time for light irradiation is selected properly depending on the type of a nonconductor product or semiconducting powder to be used, and the light irradiation time is preferably in the range from 1 to 180 minutes. At this time the surface of the nonconductor product is oxidized by the photo-electrochemical reaction of the semiconducting powder, and a functional group in the suspended solution is added to the surface of the nonconductor product where the polar group is formed to significantly increase the chemical bond, making the adherence of the surface to the plated coating firm. In particular, irradiation of a mercury lamp for 5 to 30 minutes is preferable. Upon irradiating the light, it is more preferable that supersonic vibration is carried out at intervals of every certain period of time in order to remove semiconducting powder absorbed on the surface of a nonconductor product.

As the polar group formed on the surface of the nonconductor product, for example, a carbonyl group (C=O), carboxyl group (COOH) and the like are exemplified. If, for example, anatase-type titanium dioxide is used as the semiconducting powder, the reaction proceeds from hydroxide radicals generated by the chemical reaction with water, which forms the carbonyl group having a hydrophilicity on the surface of the nonconductor product to improve the wettability on the surface of the same. Polar groups may be formed on any layer formed on the surface of the nonconductor product according to the common procedure, while the polar group is preferably formed directly on the surface of the nonconductor product.

In this invention, the nonconductor product refers to a molding made of a material having a large electrical resistance and, for practical use, of that used as an electrical insulating material, so that examples of the material are a resin, rubber, ceramic, glass and the like. When the material is a resin, the type of the resin to be used is not specifically limited, and, for example, an acrylonitrile-butadiene-styrene resin (ABS resin), polyimide resin, epoxy resin, polyethylene terephthalate resin (PET resin), and polystyrene resin (PS resin) is exemplified. The form of the resin is not in any way limited but it may have the form of a plate, sphere, particle, and the like.

In this invention, when a resin product is used as the nonconductor product, the semiconducting powder described above may be contained in the resin product to be used, and the preferable semiconducting powder is anatase-type titanium dioxide. The content of semiconducting powder in the resin on its surface is preferably less than 80% by weight.

Electroless plating is then performed in the same way as the conventional treatment of electroless plating on the surface of the nonconductor product on which the polar group is formed.

(2) The method of plating a nonconductor product to solve the second problem is that the subject to be plated is a resin product, and electroless plating is performed onto the resin product after the resin product is treated with ultraviolet radiation through water or a solution. A resin product refers to a molding made of a resin.

When the resin product is irradiated by ultraviolet radiation through water or a solution, the resin product is cooled due to the absorption of heat rays by the water or solution first or the evaporation of water, which can prevent the resin product from being overheated, inhibiting deformation thereof by heat. Further, even when the dosage of the ultraviolet irradiation increases, there does not occur such a problem as a decrease in adherent strength of the plated coating. It is contemplated that this is because the surface of the resin is somewhat oxidized and activated by the hydroxyl groups of the water.

When the resin product is irradiated by ultraviolet radiation through water or a solution, it is also possible that at least the surface of the resin product to be irradiated in the state of being wet with water or a solution may be subjected to ultraviolet irradiation, but it is preferable that the resin product in the state of being soaked in water or a solution is subjected to ultraviolet irradiation from outside the vessel. With this method, a sufficient volume of water is secured, which can further inhibit the temperature of the resin product from rising and prevent the thermo-deformation thereof.

The resin used herein is one which generates active groups on its surface by ultraviolet irradiation, and the resin of this kind is illustrated by a polyethylene resin, polypropylene resin, ABS resin, acrylonitrile-styrene copolymer (AS resin), PS resin, acrylonitrile resin (AN resin), epoxy resin, polymethylmethacrylate resin (PMMA resin), polyacetal resin (PA resin), polyester resin, polyoxymethylene resin (POM resin), polycarbonate (PC resin), PET resin, polybutylene terephthalate resin (PBT resin), polyimide resin, and polyphenyl sulfide resin and the like.

As ultraviolet rays to be irradiated, any electromagnetic waves within the ultraviolet region can be used, while in consideration of activating the surface of the resin product, electromagnetic waves with a wavelength in the range from 400 nm to 50 nm is preferably used, more preferably, less than 310 nm, further preferable less than 260 nm, and further preferably in the range from about 150 to about 200 nm. The dosage of ultraviolet irradiation is preferably more than 50 mJ/cm$^2$.

The light source which can irradiate such ultraviolet rays as described above can be a low-pressure mercury lamp, high-pressure mercury lamp, excimer laser, barrier discharge lamp, dielectric barrier discharge lamp, microwave electrodeless discharge lamp, overdischarge lamp, and the like. When the resin product is soaked in water or a solution and irradiated by ultraviolet rays, the use of a vessel into which ultraviolet rays can easily penetrate is preferable, and the use of a transparent silicic vessel is especially preferable.

As the solution described above, it is preferable to use a solution containing a dissolved oxidizing agent or alkali material. When a solution containing a dissolved oxidizing agent or alkali material is used, activation on the resin surface by ultraviolet irradiation is expedited so that the adherent strength of the plated coating is improved, even when the dosage of ultraviolet irradiation is decreased. The heat quantity received by the resin product can thus be reduced, enabling the further prevention of the resin product from deforming by heat. In the meantime, in order to reduce the dosage of ultraviolet irradiation, either weakening the light from the light source or shortening the time of irradiation is available.

As the oxidizing agent, sodium perchlorate, potassium perchlorate, sodium peroxide, potassium peroxide, hydrogen peroxide and the like are exemplified. As the alkali material, sodium hydroxide, potassium hydroxide and the like are preferable, and ammonia can also be used in some cases. The concentration of the oxidizing agent or alkali material in a solution is not specifically limited, but it is preferable to determine the concentration by trial and error in accordance with the type of oxidizing agent or alkali material as well as of the resin product.

Further, when the resin material is soaked in water or a solution to be irradiated by ultraviolet rays, the irradiation is preferably carried out while bubbling air. By doing so, ultraviolet rays are diffusely reflected by the bubbles so that they can be irradiated even onto a shadowed section situated in a dead area of the light axis of the resin product, enabling the formation of a plated coating having high adherent strength also in the shadowed section. The bubbles may be of atmosphere air and the use of an oxidizing gas such as ozone is also preferable.

The resin product after the ultraviolet treatment as described above can be subjected to electroless plating without any pretreatment, but is preferably subjected to a second treatment in which at least one of the anionic surfactant and nonionic surfactant, and a solution containing an alkali ingredient(s) are contacted with the resin product.

In this process of the second treatment, it is contemplated that the hydrophobic group of the surfactant after the ultraviolet treatment absorbs the active group turning up onto the surface of the resin product. The alkali ingredient has a function of dissolving the surface of the resin product on the molecular level, which enables an embrittled layer on the surface of the resin product to be removed to turn up more active groups. Thus the surfactant also absorbs another active group turning up onto the surface of the resin product by removing the embrittled layer.

As the surfactant, the one whose hydrophobic group easily absorbs at least one of the functional group consisting of C=O and C—OH is used so that at least one of the anionic surfactant or nonionic surfactant is employed. If a cationic surfactant and neutral surfactant is used, a plated coating may not be formed or it may be difficult to produce a desired effect. As the anionic surfactant, sodium lauryl sulfate, potassium lauryl sulfate, sodium stearyl sulfate, potassium stearyl sulfate, and the like is exemplified. As the nonionic surfactant, polyoxyethylene dodecyl ether, polyethyleneglycol dodecyl ether, and the like is exemplified.

As the alkali ingredient, the ingredient which can dissolve the surface of a resin product on the molecular level to remove an embrittled layer can be used, and sodium hydroxide, potassium hydroxide, lithium hydroxide, and the like is employed.

As a solvent of the solution containing the surfactant and alkali ingredient, a polar solvent is preferably used, so that water can be typically employed, while alcohol solvents or a water-alcohol mixed solvent can be used if necessary. In order to contact a solution with a resin product, measures including soaking the resin product in the solution, applying the solution on the surface of the resin product, and spraying the solution onto the surface of the resin product can be carried out.

The concentration of the surfactant in a solution is preferably in the range from 0.01 to 10 g/L. If the concentration of the surfactant in a solution is less than 0.01 g/L, the adherence of the plated coating is lowered, while if the concentration of the surfactant in a solution is more than 10 g/L, the adherence of the plated coating is also lowered because the surfactant turns to be in the state of association with an excessive surfactant remaining as impurities. In this case, the excessive surfactant can be removed by washing the resin product with water after the treatment.

The concentration of the alkali ingredient in a solution preferably has a pH of 12 or more. Although some effects can be obtained with a pH less than 12, the active group turning up onto the surface becomes less and the adherence of the catalytic metal decreases, making it difficult to form a plated coating.

The contact time of the solution with the resin product in the second treatment is not specifically limited, but it is preferably more than one minute at room temperature. If the contact time is too short, the amount of the surfactant absorbing the active group may be insufficient to lower the adherence of the plated coating. If the contact time is too long, however, even the layer where the active group turns up may be dissolved to make electroless plating difficult so that a contact time in the range from about 1 to about 5 minutes is enough. Further, a higher temperature is preferable in the second treatment. While the higher the temperature is, the shorter the contact time becomes, a temperature in the range from room temperature to about 60° C. is enough.

In the second treatment, the surfactant may be absorbed after treatment with a solution containing only an alkali ingredient, but the treatment is preferably made in the state where at least one of the anionic surfactant and the nonionic surfactant, and the alkali ingredient coexist because an embrittled layer may be formed again before the absorption of the surfactant.

After the second treatment, a process to wash with water and remove the alkali ingredient may be carried out. It is understood that, as the surfactant firmly absorbs the active group, it is not removed by washing with water and the like but keeps the state of absorption. Thus the resin product treated as described does not lose the effect even if a certain period of time passes before the electroless plating treatment.

In the electroless plating treatment, the resin product absorbing the surfactant is first contacted with a catalyst. It is contemplated that the catalyst is absorbed by the hydrophilic group of the surfactant absorbing the active group and by performing electroless plating on the resin product having sufficiently absorbed the catalyst, it is considered that the surfactant is freed from the functional group while the functional group is bonded to the plating metal so that a plated coating having excellent adherent strength can be formed.

As the catalyst, one used for conventional electroless plating including $Pd^{2+}$ may be employed. In order to make the catalyst absorb onto the surface of the resin product, a solution of the catalyst may be simply contacted with the surface of the resin product, which can be carried out in the same way as the contact thereof with a solution described above. Conditions such as the contact time and temperature are the same as those in the conventional procedure. Conditions of electroless plating, the type of metal to be deposited and the like are not limited and are also the same as those in the conventional procedure.

(3) If electroless plating or electroplating according to the common procedure is further performed on the electroless plating layer formed with the method of plating a nonconductor product described about in (1) and (2), a plated layer having further excellent endurance can be obtained, so that it is preferable that electroless plating or electroplating is further performed on the electroless plated layer.

In the method (1) described above of plating a nonconductor product, the method (2) of plating a nonconductor product, and the method (3) of plating a nonconductor product, as electroless plating metal, for example, a metal selected from the group consisting of nickel, copper, gold, silver, and a metallic compound thereof is exemplified, and nickel or copper is preferable. As an electroplating metal, copper, nickel, chromium, tin-nickel, gold, and the like is exemplified.

(4) Of the plated nonconductor products obtained with the methods of plating a nonconductor product as described in (1) to (3), those in the form of a board are plated to be used as print-wiring boards and the like, those in the form of a particle are plated to be used as conductive particles, and those dispersed in vehicles are plated to be used as conductive adhesive agents, paint, and the like. If the plated nonconductor product is used as print-wiring boards, it may have a multilayered structure alternately laminating a plated layer and an insulated layer on a basal board. Further, the plated nonconductor product has a metallic luster and the plated coating thereof firmly adheres onto the material surface so that such plated nonconductor product can be used for wheeled vehicles, information equipment, office equipment, ornamental articles and the like.

EXAMPLES

The present invention is specifically described below with reference to the examples. The present invention, however, is not limited to these examples.

Example 1

As the nonconductor product, a resin basal board (25×100 mm) formed of an ABS resin was employed. An anatase-type titanium dioxide, semiconducting powder, having the particle diameter of 1.0 µm was put into a solution with a nitric acid content of 5% by weight to prepare a solution with a powder content of 10% by weight and was agitated with a magnetic stirrer to obtain a solution with the powder uniformly dispersed and suspended therein. The ABS resin basal board was soaked in the solution and was irradiated with ultraviolet rays having the wavelength of 245 nm from the light source of a mercury lamp for 10 minutes to form the carbonyl groups on the surface of the ABS resin board. The surface of the ABS resin board formed with the carbonyl groups was activated according to the common procedure and was subjected to electroless nickel plating. Then the surface of the ABS resin board was further subjected to electric copper plating. The adherent force between the plated layer obtained and the surface of the ABS resin board was 1.0 kgf/cm or more. Further, the backside of the basal board which was not directly irradiated with ultraviolet rays was, like in the section subjected to direct irradiation, electroless nickel-plated during the electroless plating, and was electrolytically copper-plated during the electroplating, with the adherent force between the plated layer obtained and the surface of the ABS resin basal board being 1.0 kgf/cm or more.

In order to evaluate the adherent force, after the electroplating, vents were cut at 1 cm intervals reaching from the plated layer down to the resin basal board and the adherent strength of the plated coating was measured with a tensile tester.

Example 2

As the nonconductor product, a resin basal board (25×100 mm) formed of a polyimide resin was used, except that the same procedure as Example 1 was employed to form the carbonyl groups on the surface of the polyimide resin board, then to perform electroless nickel plating according to the common procedure, and to carry out electrolytic copper plating. The adherent force between the obtained plating layer and the surface of the resin board was 1.0 kgf/cm or more. Further, the backside of the basal board which was not directly irradiated with ultraviolet rays was, like in the section, subjected to direct irradiation, electroless nickel-plated during the electroless plating, and was electrolytic copper-plated during the electroplating, with the adherent force between the plated layer obtained and the surface of the resin basal board being 1.0 kgf/cm or more.

Example 3

As the nonconductor product, a resin basal board (25×100 mm) formed of an epoxy resin was employed and a solution with nitric acid content of 10% by weight was used, except that the same procedure as Example 1 was employed to form the carbonyl groups on the surface of the epoxy resin board, then to perform electroless nickel plating according to the common procedure, and to carry out electrolytic copper plating. The adherent force between the plated layer obtained and the surface of the ABS resin board was 1.0 kgf/cm or more. Further, a through hole with a hole diameter of 1 mm was opened onto the epoxy resin board to similarly perform electroless nickel plating and then electrolytic copper plating. The plated epoxy resin board obtained was subjected to a pulling-out test of the through hole according to JIS C5012 8.3, with the result of the test being 8 kg or more.

Example 4

As the nonconductor product, a flexible resin basal board (25×100 mm) formed with polyimide resin was used, except that the same procedure as Example 1 was employed to form the carbonyl groups on the surface of the polyimide resin board, then to perform electroless copper plating according to the common procedure. Then electrolytic copper plating was carried out on the layer plated with electroless copper plating. The adherent force between the plated layer obtained and the surface of the resin board was 0.7 kgf/cm or more. Further, the backside of the basal board, which was not directly irradiated with ultraviolet rays, was, like in the section subjected to direct irradiation, electroless copper-plated during the electroless plating, and was electrolytic copper-plated during the electroplating, with the adherent force between the plated layer obtained and the surface of the resin basal board being 0.7 kgf/cm or more.

Example 5

As the nonconductor product, a flexible resin basal board (25×100 mm) formed with PET (polyethylene terephthalate) resin was used, except that the same procedure as Example 1 was employed to form the carbonyl groups on the surface of the PET resin board and to perform electroless copper plating according to the common procedure. Then electrolytic copper plating was carried out on the layer plated with the electroless copper plating. The adherent force between the plated layer obtained and the surface of the resin board was 0.9 kgf/cm or more. Further, the backside of the basal board which was not directly irradiated with ultraviolet rays was, like in the section subjected to direct irradiation, electroless copper-plated during the electroless plating, and was electrolytically copper-plated during the electroplating, with the adherent force between the plated layer obtained and the surface of the resin basal board being 0.9 kgf/cm or more.

Example 6

As the nonconductor product, the anatase-type titanium dioxide having the particle diameter of 1.0 μm was uniformly mixed into an epoxy resin in liquid form to prepare a mixture with the titanium dioxide content of 50% by weight and the mixture was applied to have a thickness or 50 μm on an epoxy basal board (25×100 mm), and a solution with a nitric acid content of 10% by weight was used, except that the same procedure as Example 1 was employed to form carbonyl groups on the surface of the epoxy resin board, then to perform electroless nickel plating according to the common procedure, and to carry out electrolytic copper plating. The adherent force between the plated layer obtained and the surface of the resin board was 1.0 kgf/cm or more.

Example 7

As the nonconductor product, spherical particles having an average particle diameter of 5 μm formed of a polystyrene resin was employed and a solution with a nitric acid content of 10% by weight was used, except that the same procedure as Example 1 was employed to form the carbonyl groups on the surface of the polystyrene resin-made spherical particles. Then, the surface of the polystyrene resin-made particles formed with carbonyl groups were activated according to the common procedure to be subjected to electroless nickel plating. Then electrolytic copper plating was carried out on the surface of the particles, with which the adherent strength of the plated layer obtained was excellent and capable of being used as conductive particles.

Example 8

Figure 1:
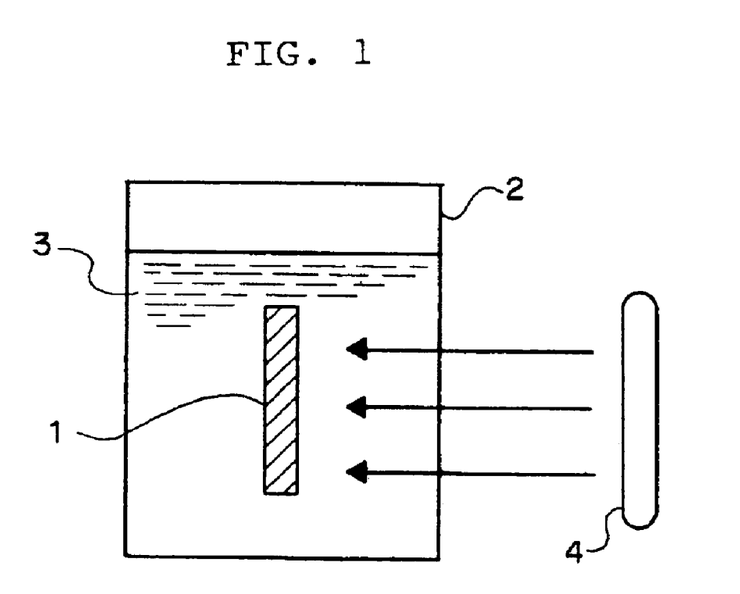
FIG. 1 is an explanatory view showing the state where ultraviolet treatment is performed according to one embodiment of the present invention, and in the FIGURE, the reference numeral 1 indicates a resin board, 2 a transparent silicic vessel, 3 pure water, and 4 a high-pressure mercury lamp.

As the nonconductor product, a resin board 1 defatted and made of an ABS resin was used, and as shown in FIG. 1, the board 1 was soaked in pure water 3 filled in a transparent silicic vessel 2 to be irradiated with ultraviolet rays from outside the vessel 2 using a 1 kw high-pressure mercury lamb 4. Ultraviolet rays were irradiated for 5 types of periods of time as a reference, namely, 1, 3, 5, 7, and 10 minutes to make each resin board 1 treated with ultraviolet rays.

Next a solution dissolving and mixing 50 g/L NaOH and 1 g/L sodium lauryl sulfate was heated to 60° C. to soak therein each of the ultraviolet-treated resin boards for 2 minutes and to absorb an anionic surfactant (sodium lauryl sulfate).

Each resin board absorbing the surfactant was taken out from the solution to be washed with water and dried, was soaked for 3 minutes in a catalytic solution in which a palladium chloride content of 0.1% by weight as well as a tin chloride content of 5% by weight was dissolved in a 3N hydrochloric acid solution to be heated to 50° C., and was further soaked for 3 minute in a 1N hydrochloric acid solution to activate the palladium. Thereby, the resin board absorbing catalyst for use in plating was obtained.

Each resin board used in plating was then soaked in a nickel chemical plating bath kept warm at a temperature of 40° C. to deposit a nickel plated coating for 10 minutes. The nickel plated coating deposited had a thickness of 0.5 μm. Each resin board was then soaked in a copper sulfate Cu electroplating bath to deposit a copper plating of 100 μm on the surface of the nickel plated coating.

A depth of cut was inserted on the plated coating of each obtained resin board at 1 cm intervals reaching down to the resin basal board and the adherent strength of the plated coating was measured with a tensile tester. Visual evaluation was also made concerning the external appearance of each resin board. The result is shown in Table 1.

Example 9

A solution with sodium perchlorate having the concentration of 5% by weight was used instead of pure water, except that the same procedure as Example 8 was employed to perform ultraviolet treatment for 5 types of periods of time as a reference. Each resin board was then subjected to a plated coating formation with the same procedure as Example 8, and similarly, the adherent strength thereof was measured and visual evaluation of the external appearance thereof was made. The result as shown in Table 1.

Example 10

A solution with sodium hydroxide having the concentration of 5% by weight was used instead of pure water, except that the same procedure as Example 8 was employed to perform ultraviolet treatment for 5 types of periods of time as a reference. Each resin board was then subjected to a plated coating formation with the same procedure as Example 8, and similarly, the adherent strength thereof was measured and visual evaluation of the external appearance thereof was made. The result is shown in Table 1.

Comparative Example 1

Except that ultraviolet rays were irradiated in the atmosphere, the same procedure as Example 8 was employed to perform ultraviolet treatment for 5 types of periods of time as a reference. Each resin board was then subjected to a plated coating formation with the same procedure as Example 8, and similarly, the adherent strength thereof was measured and a visual evaluation of the external appearance thereof was made. The result is shown in Table 1.

Evaluation

TABLE 1

|  | Condition of UV irradiation | Time of UV irradiation (min) | Adherence Strength (kgf/cm) | Appearance of resin board |
| --- | --- | --- | --- | --- |
| Example 8 | In water | 1 | not adhering | not abnormal |
|  |  | 3 | not adhering | not abnormal |
|  |  | 5 | 0.5 | not abnormal |
|  |  | 7 | 1.0 | not abnormal |
|  |  | 10 | 1.2 | not abnormal |
| Example 9 | In a solution with sodium perchlorate | 1 | 0.6 | not abnormal |
|  |  | 3 | 1.2 | not abnormal |
|  |  | 5 | 1.2 | not abnormal |
|  |  | 7 | 1.3 | not abnormal |
|  |  | 10 | 1.4 | not abnormal |
| Example 10 | In a solution with sodium hydroxide | 1 | not adhering | not abnormal |
|  |  | 3 | 0.6 | not abnormal |
|  |  | 5 | 0.9 | not abnormal |
|  |  | 7 | 1.3 | not abnormal |
|  |  | 10 | 1.3 | not abnormal |
| Comparative Example 1 | In the atmosphere | 1 | not adhering | not abnormal |
|  |  | 3 | not adhering | not abnormal |
|  |  | 5 | 0.5 | Curve |
|  |  | 7 | 1.2 | Curve |
|  |  | 10 | 0.9 | Curve |

According to Table 1, Comparative Example 1 shows that the resin board was deformed by heating with ultraviolet irradiation for 5 minutes or more, while each Example shows that deformation by heat was prevented, even with ultraviolet irradiation for 10 minutes. It is contemplated that this is due to the prevention of overheating of the resin board with water or the solution.

Each resin board treated in Example 9 and Example 10 showed a greatly improved adherent strength compared with those treated in Example 8. It is thus obvious that the resin board is preferably treated with ultraviolet irradiation in the solution with an oxidizing agent or alkali rather than in water.

If, for example, Example 9 and Example 8 are compared with each other, the resin board treated in a sodium perchlorate solution with ultraviolet irradiation for 3 or 5 minutes had a similar adherent strength to that treated in water with ultraviolet irradiation for 10 minutes. Ultraviolet irradiation in a sodium perchlorate solution can thus shorten the irradiation time compared to the irradiation in water, which improves the productivity.

Moreover, in Example 1, the resin board treated with ultraviolet irradiation for 10 minutes had a lower adherence strength compared to that treated with ultraviolet irradiation for 7 minutes, while in Example 8, the resin board treated with ultraviolet irradiation for 10 minutes had a further higher adherence strength compared to that treated with ultraviolet irradiation for 7 minutes. Namely, ultraviolet irradiation in water can prevent the adherent strength from deteriorating from irradiation for a longer period of time.

Example 11

As the nonconductor product, a radiator grill molded from an ABS resin was used. The radiator grill was soaked in pure water filled in a transparent silicic vessel having 20 air bubbling openings on its lower part, and was irradiated with ultraviolet rays for 15 minutes using the same procedure as Example 8, while air was bubbling from the air bubbling openings. The radiator grill was then subjected to a plated coating formation as in Example 8.

Example 12

As the nonconductor product, a radiator grill of the same kind as that used in Example 11 was employed and air bubbling was not carried out, except that the same procedure as Example 11 was performed to irradiate ultraviolet rays, and similarly the radiator grill was subjected to a plated coating formation.

Evaluation

In Example 11 and Example 12, deformation was not observed in either radiator grill. In Example 12, a plated coating was not formed on a shadowed section from ultraviolet radiation situated in a dead area of the light axis. This is because the nickel plated coating did not adhere (stripped off). In Example 11, on the other hand, a plated coating was formed all over the radiator grill with a high adherence strength. It is obvious that this results from the effect of air bubbling.

Industrial Availability

With the method of plating a nonconductor product according to the present invention, a plated layer firmly adhered to the surface of the nonconductor product can be formed without laying a burden on the environment. Further, when the treatment for surface roughening and addition of the polar group is made before electroless plating, it is not necessary to use chemicals such as chromic anhydride and permanganic acid, which does not cause the problem of environmental pollution, and enables the treatment of waste liquids at a low disposal cost, and is economically advantageous as well.

With the method of plating a nonconductor product using a resin product as an object to be plated, deformation by heat of the resin product can be certainly prevented. Further, if a solution with a reducing agent(s) or alkali is used during ultraviolet irradiation, the adherent strength of a plated coating can be improved, so that it is possible to shorten the irradiation time, which increases the productivity. In addition, if bubbling is carried out in ultraviolet irradiation, a plated coating having an excellent adherent strength is formed also on a shadowed section from ultraviolet radiation situated in a dead area of the light axis.

Further, with the method of plating a nonconductor product according to the present invention, a plated nonconductor product having an endurance and fanciness can be obtained. Depending on the form of the nonconductor product to be used, that in the form of a board is plated to be used as a print-wiring board and the like, that in the form of a particle is plated to be used as a conductive particle, and that dispersed in vehicles is plated to be used as a conductive adhesive agent, paint, and the like. The plated nonconductor product has a metallic luster and the plated coating is firmly adhered to the material surface, which enables the plated nonconductor product to be used for, for example, wheeled vehicles, information equipment, office equipment, ornamental articles and the like, and is extremely useful for functional plated products and ornamental plated products.

What is claimed is:

1. A method of plating a nonconductor product, comprising the steps of soaking the nonconductor product in a solution suspending a semiconducting powder; forming a polar group on a surface of the nonconductor product by light irradiation in the solution; and performing electroless plating on the surface on which said polar group is formed.

2. The method of plating a nonconductor product according to claim 1, wherein the powder is selected from the group consisting of titanium dioxide, zinc oxide, cadmium sulfide, gallium phosphide, silicon carbide, indium oxide, and vanadium oxide.

3. The method of plating a nonconductor product according to claim 1, wherein the semiconducting powder has a particle diameter in the range from 0.1 to 1,000 $\mu$m.

4. The method of plating a nonconductor product according to claim 1, wherein the solution suspending the semiconducting powder is an aqueous or nonaqueous solution.

5. The method of plating a nonconductor product according to claim 1, wherein the irradiated light is ultraviolet light or visible light.

6. The method of plating a nonconductor product according to claim 1, wherein the polar group is formed directly on the surface of the nonconductor product.

7. The method of plating a nonconductor product according to claim 1, wherein the nonconductor product is formed with material selected from the group consisting of resin, rubber, ceramic and glass.

8. The method of plating a nonconductor product according to claim 1, wherein the nonconductor product comprises a resin containing semiconducting powder.

9. The method of plating a nonconductor product according to claim 1, wherein electroplating with a different or the same kind of metal is further performed on an electroless-plated layer formed by electroless plating.

10. The method of plating a nonconductor product according to claim 1, wherein electroless plating with a different or the same kind of metal is further performed on an electroless-plated layer formed by electroless plating.

11. The method of plating a nonconductor product according to claim 9, wherein, in electroless plating, metal selected from the group consisting of nickel, copper, gold, silver, and a metallic compound thereof is used.

12. A method of plating a nonconductor resin product, comprising the steps of soaking the resin product in water or a solution; bubbling air bubbles in the water or solution while carrying out ultraviolet treatment of the resin product and electroless plating the resin product to form an electroless plating layer thereon.

13. The method of plating a nonconductor product according to claim 12, wherein the solution is a solution containing a dissolved oxidizing agent or alkali material.

14. The method of plating a nonconductor product according to claim 12, wherein, after the ultraviolet treatment and before the electroless plating, a second treatment is performed in which the resin product is contacted with at least one of an anionic surfactant and a nonionic surfactant as well as a solution containing an alkali ingredient(s).

15. The method of plating a nonconductor product according to claim 12, wherein electroplating with a different or the same kind of metal is further performed on the electroless-plated layer formed by electroless plating.

16. The method of plating a nonconductor product according to claim 12, wherein a second step of electroless plating with a different or the same kind of metal is further performed on the electroless-plated layer formed by the electroless plating.

17. The method of plating a nonconductor product according to claim 15, wherein, in the electroless plating, a metal selected from the group consisting of nickel, copper, gold, silver, and a metallic compound thereof is used.

* * * * *

UNITED STATES PATENT AND TRADEMARK OFFICE
CERTIFICATE OF CORRECTION

PATENT NO. : 6,992,000 B2   Page 1 of 1
DATED : January 31, 2006
INVENTOR(S) : Hideo Honma et al.

It is certified that error appears in the above-identified patent and that said Letters Patent is hereby corrected as shown below:

<u>Title page,</u>
Item [75], Inventors, should read:
-- Hideo Honma, Yokohama (JP);
  Atsushi Kawahara, Yokohama (JP);
  Taiji Nishiwari, Koshigaya (JP);
  Takeshi Bessho, Toyota (JP);
  Masatsugu Nakanishi, Toyota (JP);
  Shigeru Suzuki, Yokosuka (JP); and
  Akira Teranishi, Yokosuka (JP) --.
Item [73], Assignees, should read:
-- Kanto Kasel Co., Ltd., Yokosuka (JP);
  Kanto Gakuin University Surface Engineering Research Institute, Yokohama (JP);
Toyota Jidosha Kabushiki Kaisha, Toyota (JP) --.

Signed and Sealed this

Thirtieth Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,992,000 B2
APPLICATION NO. : 10/486169
DATED : January 31, 2006
INVENTOR(S) : Hideo Honma et al.

It is certified that error appears in the above-identified patent and that said Letters Patent is hereby corrected as shown below:

Title page,
Item [75], Inventors, should read:
-- Hideo Honma, Yokohama (JP);
  Atsushi Kawahara, Yokohama (JP);
  Taiji Nishiwaki, Koshigaya (JP);
  Takeshi Bessho, Toyota (JP);
  Masatsugu Nakanishi, Toyota (JP);
  Shigeru Suzuki, Yokosuka (JP); and
  Akira Teranishi, Yokosuka (JP) --.
Item [73], Assignees, should read:
-- Kanto Kasei Co., Ltd., Yokosuka (JP);
  Kanto Gakuin University Surface Engineering Research Institute, Yokohama (JP);
Toyota Jidosha Kabushiki Kaisha, Toyota (JP) --.

This certificate supersedes Certificate of Correction issued May 30, 2006.

Signed and Sealed this

Ninth Day of January, 2007

JON W. DUDAS
*Director of the United States Patent and Trademark Office*